United States Patent
Lee et al.

(10) Patent No.: US 10,008,468 B2
(45) Date of Patent: Jun. 26, 2018

(54) PACKAGED MICROELECTRONIC DEVICES AND METHODS FOR MANUFACTURING PACKAGED MICROELECTRONIC DEVICES

(71) Applicant: Micron Technology, Inc., Boise, ID (US)

(72) Inventors: Choon Kuan Lee, Singapore (SG); Chin Hui Chong, Singapore (SG); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/388,166

(22) Filed: Dec. 22, 2016

(65) Prior Publication Data
US 2017/0103961 A1   Apr. 13, 2017

Related U.S. Application Data

(60) Continuation of application No. 14/604,545, filed on Jan. 23, 2015, now Pat. No. 9,530,748, which is a
(Continued)

(51) Int. Cl.
*H01L 23/02* (2006.01)
*H01L 23/00* (2006.01)
*H01L 23/48* (2006.01)

(52) U.S. Cl.
CPC ............ *H01L 24/29* (2013.01); *H01L 23/481* (2013.01); *H01L 2224/29005* (2013.01)

(58) Field of Classification Search
CPC ....... H01L 2924/00; H01L 2224/73265; H01L 2224/48227; H01L 2224/32225; H01L 2924/00014; H01L 2924/00012; H01L 2224/32145; H01L 2924/15311; H01L 2224/48091; H01L 2224/48247; H01L 2924/181

See application file for complete search history.

(56) References Cited

U.S. PATENT DOCUMENTS 6,388,313 B1   5/2002 Lee et al.
6,528,869 B1   3/2003 Glenn et al.
(Continued)

OTHER PUBLICATIONS

Todd, Michael et al., "Enabling Next-generation Stacked-die Applications," Advanced Packaging, Apr. 2008, <http://ap.pennnet.com/display_article/325751/36/ARTCL/none/none/1/Enabling-Next-generation-Stacked-die-Applications/>.
(Continued)

*Primary Examiner* — Robert Bachner
(74) *Attorney, Agent, or Firm* — Perkins Coie LLP

(57) ABSTRACT

Packaged microelectronic devices and methods for manufacturing packaged microelectronic devices are disclosed herein. In one embodiment, a packaged microelectronic device can include a support member, a first die attached to the support member, and a second die attached to the first die in a stacked configuration. The device can also include an attachment feature between the first and second dies. The attachment feature can be composed of a dielectric adhesive material. The attachment feature includes (a) a single, unitary structure covering at least approximately all of the back side of the second die, and (b) a plurality of interconnect structures electrically coupled to internal active features of both the first die and the second die.

14 Claims, 8 Drawing Sheets

Related U.S. Application Data division of application No. 13/298,140, filed on Nov. 16, 2011, now Pat. No. 8,940,581, which is a division of application No. 12/796,740, filed on Jun. 9, 2010, now Pat. No. 8,148,807, which is a division of application No. 12/136,717, filed on Jun. 10, 2008, now Pat. No. 7,745,920.

(56) References Cited

U.S. PATENT DOCUMENTS

| | | |
|---|---|---|
| 6,555,917 B1 | 4/2003 | Heo |
| 6,608,371 B2 | 8/2003 | Kurashima et al. |
| 6,650,007 B2 | 11/2003 | Moden et al. |
| 6,734,549 B2 | 5/2004 | Takeoka et al. |
| 6,784,023 B2 | 8/2004 | Ball |
| 6,849,945 B2 | 2/2005 | Horiuchi et al. |
| 6,867,500 B2 | 3/2005 | Corisis et al. |
| 6,914,259 B2 | 7/2005 | Sakiyama et al. |
| 6,916,725 B2 | 7/2005 | Yamaguchi |
| 6,919,627 B2 | 7/2005 | Liu et al. |
| 6,946,325 B2 | 9/2005 | Yean et al. |
| 7,138,710 B2 | 11/2006 | Fukazawa |
| 7,321,455 B2 | 1/2008 | Kinsman |
| 7,335,522 B2 | 2/2008 | Wang et al. |
| 7,335,533 B2 | 2/2008 | Derderian |
| 7,352,067 B2 | 4/2008 | Fukaishi et al. |
| 7,358,602 B2 | 4/2008 | Hara |
| 7,492,039 B2 | 2/2009 | Seng |
| 7,535,102 B2 | 5/2009 | Lin |
| 7,578,184 B2 | 8/2009 | Fontanella et al. |
| 7,598,617 B2 | 10/2009 | Lee et al. |
| 7,638,869 B2 | 12/2009 | Irsigler et al. |
| 7,655,504 B2 | 2/2010 | Mashino |
| 7,741,150 B2 | 6/2010 | Leow et al. |
| 7,754,531 B2 | 7/2010 | Tay et al. |
| 7,807,505 B2 | 10/2010 | Farnworth et al. |
| 7,825,468 B2 | 11/2010 | Kwon et al. |
| 2003/0030151 A1 | 2/2003 | Morozumi |
| 2003/0215984 A1 | 11/2003 | Pogge et al. |
| 2005/0051883 A1 | 3/2005 | Fukazawa |
| 2005/0104209 A1 | 5/2005 | Kang |
| 2005/0136634 A1 | 6/2005 | Savastiouk et al. |
| 2005/0287706 A1 | 12/2005 | Fuller et al. |
| 2006/0006534 A1 | 1/2006 | Yean et al. |
| 2006/0121690 A1 | 6/2006 | Pogge et al. |
| 2006/0202319 A1 | 9/2006 | Swee Seng |
| 2007/0045814 A1 | 3/2007 | Yamamoto et al. |
| 2007/0132089 A1 | 6/2007 | Jiang et al. |
| 2007/0155048 A1 | 7/2007 | Lee et al. |
| 2008/0054489 A1 | 3/2008 | Farrar et al. |
| 2008/0169545 A1* | 7/2008 | Kwon .................. H01L 21/6835 257/686 |
| 2008/0169548 A1 | 7/2008 | Baek |
| 2008/0176358 A1* | 7/2008 | Liu .......................... H01L 24/32 438/109 |
| 2008/0203554 A1 | 8/2008 | Nishio et al. |
| 2008/0237824 A1 | 10/2008 | St. Amand et al. |
| 2008/0237881 A1 | 10/2008 | Dambrauskas et al. |
| 2008/0283971 A1 | 11/2008 | Huang et al. |
| 2008/0308946 A1 | 12/2008 | Pratt |
| 2008/0315331 A1 | 12/2008 | Wodnicki et al. |
| 2009/0085220 A1 | 4/2009 | Bernhardt et al. |
| 2009/0140392 A1 | 6/2009 | Park |
| 2009/0166846 A1 | 7/2009 | Pratt et al. |
| 2009/0261457 A1 | 10/2009 | Pratt |
| 2009/0278244 A1 | 11/2009 | Dunne et al. |
| 2009/0283898 A1 | 11/2009 | Janzen et al. |
| 2009/0302484 A1 | 12/2009 | Lee et al. |
| 2010/0244272 A1 | 9/2010 | Lee et al. |
| 2010/0246144 A1 | 9/2010 | Yamazaki et al. |
| 2012/0187567 A1 | 7/2012 | Lee et al. |

OTHER PUBLICATIONS

Todd, Michael, "Material systems enable high density packaging," Electronics Manufacturing Asia, Apr. 2008, <http://www.emasiamag.com/article-3528-materialsystemsenablehighdensitypackaging-Asia.html>.

* cited by examiner

PACKAGED MICROELECTRONIC DEVICES AND METHODS FOR MANUFACTURING PACKAGED MICROELECTRONIC DEVICES

CROSS-REFERENCE TO RELATED APPLICATIONS

This application is a continuation of U.S. application Ser. No. 14/604,545, filed Jan. 23, 2015, which is a divisional of U.S. application Ser. No. 13/298,140 filed Nov. 16, 2011, now U.S. Pat. No. 8,940,581, which is a divisional of U.S. application Ser. No. 12/796,740 filed Jun. 9, 2010, now U.S. Pat. No. 8,148,807, which is a divisional of U.S. application Ser. No. 12/136,717 filed Jun. 10, 2008, now U.S. Pat. No. 7,745,920, each of which is incorporated herein by reference in its entirety.

TECHNICAL FIELD

The present disclosure is related to packaged microelectronic devices and methods for manufacturing packaged microelectronic devices.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, or other microelectronic assemblies. In one conventional arrangement, the die is mounted (e.g., face up or face down) to a supporting substrate (e.g., a printed circuit board), and the die bond pads are electrically coupled to corresponding bond pads of the substrate with wire bonds or metal bumps (e.g., solder balls or other suitable connections). After encapsulation, additional metal bumps can electrically connect the substrate to one or more external devices. Accordingly, the substrate supports the die and provides an electrical link between the die and the external devices.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

DETAILED DESCRIPTION

Specific details of several embodiments of the disclosure are described below with reference to packaged microelectronic devices and methods for manufacturing such devices. The microelectronic devices described below include two microelectronic dies attached to each other in a stacked configuration, but in other embodiments the microelectronic devices can have three or more stacked microelectronic dies electrically coupled to each other and, in some cases, a support member. The microelectronic devices can include, for example, micromechanical components, data storage elements, optics, read/write components, or other features. The microelectronic dies can be SRAM, DRAM (e.g., DDR-SDRAM), flash memory (e.g., NAND flash memory), processors, imagers, and other types of devices. The term "interconnect" may encompass various types of conductive structures that extend at least partially through a substrate of a microelectronic die or another component and electrically couple together conductive contacts located at opposing ends of the interconnect. Substrates can be semiconductive pieces (e.g., doped silicon wafers, gallium arsenide wafers, or other semiconductor wafers), nonconductive pieces (e.g., various ceramic substrates), or conductive pieces. Moreover, several other embodiments of the disclosure can have configurations, components, or procedures different than those described in this section. A person of ordinary skill in the art, therefore, will accordingly understand that the disclosure may have other embodiments with additional elements, or the disclosure may have other embodiments without several of the elements shown and described below with reference to FIGS. 2-6.

Figure 1A:
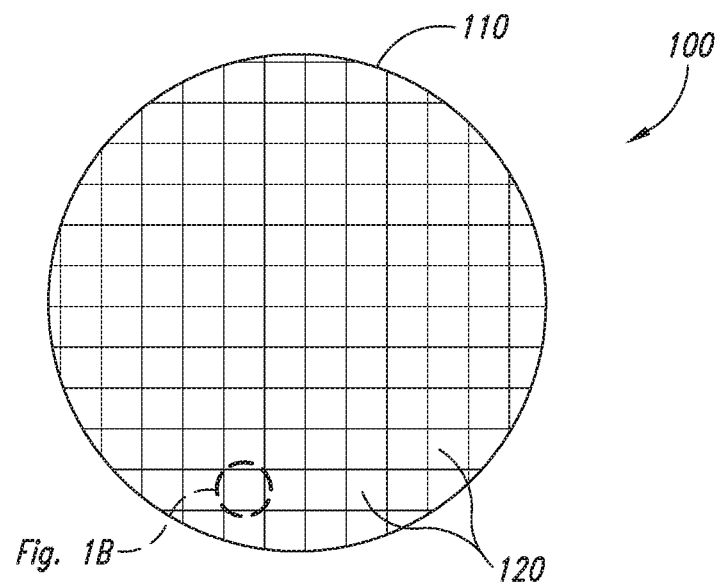
FIG. 1A is a partially schematic illustration of a representative microelectronic workpiece carrying microelectronic dies configured in accordance with embodiments of the disclosure.
Figure 1B:
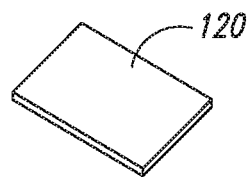
FIG. 1B is a schematic illustration of a microelectronic die singulated from the workpiece shown in FIG. 1A.

FIG. 1A is a microelectronic workpiece 100 in the form of a semiconductor wafer 110 that includes multiple microelectronic dies 120. At least some of the processes described below may be conducted on the microelectronic workpiece 100 at the wafer level, and other processes may be conducted on the individual microelectronic dies 120 of the microelectronic workpiece 100 after the dies 120 have been singulated from the larger wafer 110. Accordingly, unless otherwise noted, structures and methods described below in the context of a microelectronic workpiece can apply to the wafer 110, the dies 120 that are formed from the wafer 110, and/or an assembly of one or more dies 120 in a stacked-die configuration or attached to a support member. FIG. 1B is a schematic illustration of an individual die 120 after it has been singulated from the wafer 110 shown in FIG. 1A. The die 120 can include operable microelectronic structures, optionally encased within a protective encapsulant. The die 120 can be electrically connected to external structural devices by pins, bond pads, solder balls, redistribution structures, and/or other conductive structures.

Figure 2:
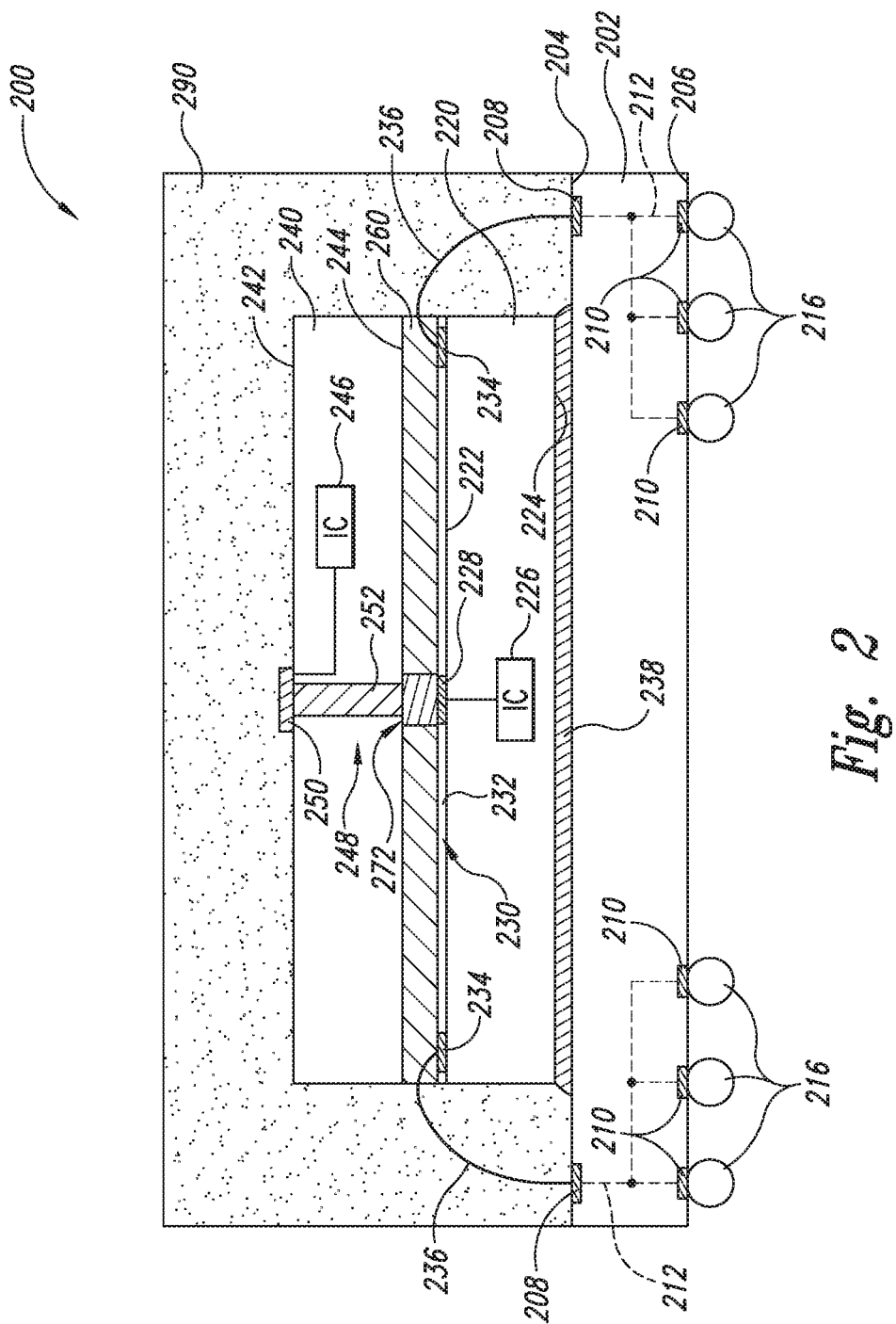
FIG. 2 is a schematic, side cross-sectional view of a packaged microelectronic device configured in accordance with an embodiment of the disclosure.

FIG. 2 is a schematic, side cross-sectional view of a microelectronic device 200 configured in accordance with an embodiment of the disclosure. The device 200 includes a first microelectronic die 220 attached to a support member 202, and a second microelectronic die 240 attached to the first die 220 in a stacked configuration. The device 200 also includes an attachment feature or structure 260 between the first die 220 and the second die 240. The attachment feature 260 is configured to provide both a mechanical and an electrical connection between the first die 220 and the second die 240, as described in greater detail below.

The support member 202 can include an interposer substrate, a printed circuit board, a lead frame, or another suitable support member. The support member 202 can be composed of an organic material, a ceramic material, or another suitable dielectric material. The support member 202 can include a first side 204 and a second side 206 opposite the first side 204. In the illustrated embodiment, the support member 202 is an interposing device that provides an array of ball-pads for coupling very small contacts on the first and/or second dies 220 and 240 to another type of device (not shown). The support member 202, for example, includes an array of support member terminals 208 at the first side 204, an array of contact pads 210 (e.g., ball-pads) at the second side 206, and a trace 212 or other type of conductive line between each support member terminal 208 and one or more corresponding contact pads 210. The contact pads 210 are arranged in an array for surface mounting the device 200 to a board or module of another device (not shown). A plurality of electrical couplers 216 (e.g., solder balls or conductive bumps) can be attached to corresponding contact pads 210. In other embodiments, the support member 202 can include different features and/or the features can have a different arrangement.

The first microelectronic die 220 can be a semiconductor die or other type of microelectronic die. The first die 220, for example, can be a processor, a memory device (e.g., a DRAM or flash memory device), a sensor, a filter, or other type of microelectronic device. The first die 220 includes an active or front side 222 and a back side 224 opposite the active side 222. The active or front side 222 generally refers to the side of the first die 220 that is accessed during formation of the active elements of the first die 220. The first die 220 also includes integrated circuitry 226 (shown schematically) and a plurality of terminals 228 (e.g., bond-pads) arranged in an array at the active side 222 and electrically coupled to the integrated circuitry 226. The terminals 228 accordingly provide external contacts to provide source voltages, ground voltages, and signals to the integrated circuitry 226 of the first die 220. The terminals 228, however, are typically so small that it is difficult to attach the terminals 228 directly to contacts on other devices in a cost-effective manner. The first die 220 accordingly includes a redistribution structure or redistribution layer (RDL) 230 at the active side 222 to redistribute the signals from the terminals 228 to a larger array of contacts.

The redistribution structure 230, for example, can include one or more dielectric layers 232, a plurality of peripheral contacts 234 at or proximate to a perimeter portion of the front or active side 222, and a plurality of traces or other conductive lines (not shown) coupling at least a portion of the terminals 228 to corresponding peripheral contacts 234. The peripheral contacts 234 can be used to electrically couple the first die 220 to the support member terminals 208 of the support member 202 (e.g., using a chip-on-board (COB) configuration) with a plurality of wire bonds 236 or other types of connectors extending between the peripheral contacts 234 and corresponding support member terminals 208. In other embodiments, the redistribution structure 230 can include different features and/or the features can have a different arrangement. In still other embodiments, the first die 220 may not include the redistribution structure 230. In several embodiments, the device 200 can further include an adhesive material 238, such as an adhesive film, epoxy, tape, paste, or other suitable material disposed between the first die 220 and the support member 202 to help attach the first die 220 to the support member 202.

The second microelectronic die 240 stacked on the first die 220 can be a semiconductor die or other type of microelectronic die. The second die 240, for example, can be a processor, a memory device (e.g., a DRAM or flash memory device), an imager, a sensor, a filter, or other type of microelectronic device. The second die 240 includes an active or front side 242 and a back side 244 opposite the active side 242. The second die 240 also includes integrated circuitry 246 (shown schematically) and electrical connectors 248 (only one is shown) electrically coupled to the integrated circuitry 246.

The electrical connectors 248 provide a small array of back side contacts within the footprint of the second die 240. The individual connectors 248, for example, can include a terminal or bond site 250 (e.g., a bond-pad) and an interconnect 252 coupled to the terminal 250. In the embodiment illustrated in FIG. 2, the terminal 250 is at the front side 242 of the second die 240 and the interconnect 252 is a through-substrate or through-wafer interconnect that extends completely through the second die 240 to electrically couple the terminal 250 to corresponding features at the back side 244. In other embodiments, however, the terminal 250 can be an internal feature that is embedded at an intermediate depth within the second die 240 and coupled to a corresponding interconnect 252 that extends through only a portion of the second die 240. In other embodiments, the first die 220 and/or the second die 240 can have different features to perform different functions.

The device 200 can also include an encapsulant, shell, or cap 290 formed or otherwise deposited over the first and second dies 220 and 240 and at least a portion of the support member 202. The encapsulant 290 enhances the integrity of the device 200 and protects the first and second dies 220 and 240 and the physical and electrical connections between the dies 220 and 240 and the support member 202 from moisture, chemicals, and other contaminants.

As mentioned previously, the device 200 further includes the attachment feature 260 between the first die 220 and the second die 240 to physically and electrically attach the first and second dies together. In several embodiments, the attachment feature 260 can comprise a film-over-wire (FOW) die attach film applied over approximately the entire back side 244 of the second die 240. The attachment feature 260 is configured to protect the wire bonds 236, the redistribution structure 230, and other delicate front side components of the first die 220 from being damaged when the second die 240 is attached to the first die 220 using a die attachment process. The attachment feature 260 further includes an interconnect structure or conductive coupler 272 extending at least partially through the attachment feature 260 and coupled to the interconnect 252 of the second die 240. The interconnect structure 272 is configured to electrically couple the interconnect 252 of the second die 240 to the terminals 228 of the first die 220. The attachment feature 260 and its respective components are described in greater detail below with reference to FIGS. 3E-3G.

Several embodiments of the microelectronic device 200 including the attachment feature 260 may provide improved package reliability and robustness as compared with conventional stacked devices. Conventional devices, for example, typically include an underfill material in a gap between an upper die and a lower die of the stacked device. The underfill material is generally dispensed into the gap by injecting the underfill material along one or two sides of the device, and the material is drawn into the gap by capillary effects. One potential drawback with this approach, however, is that it may result in a vulnerable mechanical connection between the two dies. For example, when the underfill material flows into the gap between the components, air bubbles, air pockets, and/or voids may form within the underfill material. During subsequent high temperature processes, the air trapped in these regions may expand and force the dies away from each other, damaging the mechanical and/or electrical connections between these components. This in turn often leads to failure or malfunction of such devices.

Unlike conventional stacked devices (which typically include underfill material between the upper and lower dies), several embodiments of the attachment feature 260 of the device 200 significantly reduce or eliminate the chances for air bubbles, air pockets, and/or voids to form in the gap between the two dies. For example, when the attachment feature 260 is a preformed film or tape, the quality control can ensure the film or tape is at least substantially void free within the material of the film. Eliminating the underfill material between the first and second dies 220 and 240 is expected to provide a more robust and reliable connection between the components, thereby reducing and/or eliminating the tendency for the mechanical and/or electrical connections in the device 200 to fail.

In the embodiment illustrated in FIG. 2, formation of the device 200 including the attachment feature 260 between the first and second dies 220 and 240 is complete. FIGS. 3A-4C described below illustrate various embodiments of methods for forming attachment features on microelectronic dies. Although the following description illustrates only a single interconnect adjacent to a portion of the attachment feature, it will be appreciated that (a) a plurality of interconnects are constructed simultaneously through a plurality of dies on a wafer, and (b) the attachment feature is fabricated across all or a substantial portion of a workpiece.

Figure 3A:
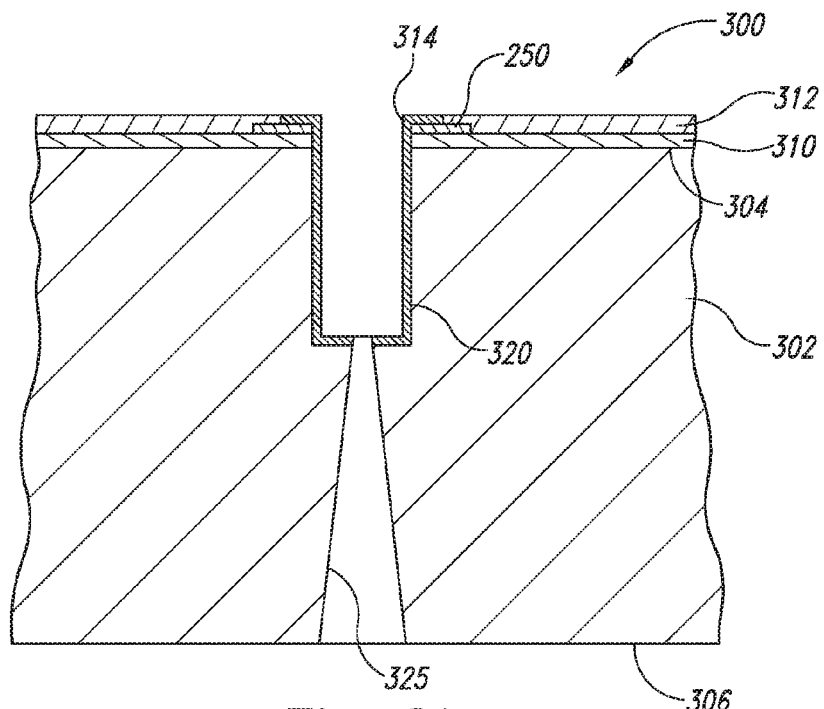
FIGS. 3A-3G illustrate various stages of a method for manufacturing a plurality of microelectronic devices having attachment features in accordance with an embodiment of the disclosure.

FIGS. 3A-3G illustrate various stages of a method for forming one embodiment of the attachment feature 260 of FIG. 2. FIG. 3A, more specifically, is a schematic, side cross-sectional view of a portion of a microelectronic workpiece 300 at an early stage of this process after constructing a substantial portion of an embodiment of the interconnect 252 (FIG. 2), but before constructing the attachment feature 260. The workpiece 300 includes a semiconductor substrate 302 having a front or active side 304, a back side 306, and a plurality of microelectronic dies (e.g., a plurality of second dies 240 of FIG. 2) formed on and/or in the substrate 302. The workpiece 300 can include several features generally similar to the workpiece 100 described above with reference to FIG. 1A. The substrate 302, for example, can be a semiconductor wafer with the dies arranged in a die pattern on the wafer. In other embodiments, however, the workpiece 300 can have a different arrangement and/or include different features.

The workpiece 300 has first and second dielectric layers 310 and 312 over at least a portion of the front side 304 of the substrate 302 to protect the substrate 302 and the terminals 250. The dielectric layers 310 and 312 and/or one or more of the subsequent dielectric layers can be parylene, low temperature chemical vapor deposition (CVD) materials, such as silicon nitride ($Si_3Ni_4$), silicon oxide ($SiO_2$), and/or other suitable dielectric materials. The foregoing list of dielectric materials is not exhaustive. The dielectric layers 310 and 312 are not generally composed of the same material as each other, but these layers may be composed of the same material. In addition, one or both of the dielectric layers 310 and 312 may be omitted and/or additional layers may be included.

The workpiece 300 also includes a plurality of vias or apertures 320 (only one is shown) formed through at least part of the substrate 302 using etching, laser drilling, or other suitable techniques. The illustrated vias 320 are blind vias that extend only partially through the substrate 302 or are otherwise closed at one end. In other embodiments, however, the vias 320 can extend entirely through the workpiece 300 and/or the substrate 302. Further details of representative methods for forming vias 320 are disclosed in U.S. Pat. No. 7,271,482, issued Sep. 18, 2007, and incorporated herein by reference in its entirety.

The via 320 is generally lined with another dielectric layer and one or more conductive layers (shown collectively as liner 314). The embodiment of the liner 314 is shown schematically as a single layer, but in many embodiments the liner 314 has a number of different dielectric and conductive materials. The dielectric layer(s) of the liner 314 electrically insulate the components in the substrate 302 from the interconnect that is subsequently formed in the via 320. The dielectric layer(s) of the liner 314 can include materials similar to those of the dielectric layers 310 and 312 described above. The conductive layer(s) of the liner 314 can include tantalum (Ta), tungsten (W), copper (Cu), nickel (Ni), and/or other suitable conductive materials. After lining the via 320, a vent hole 325 may be formed in the substrate 302 to extend from a bottom portion of each via 320 to the back side 306 of the substrate 302.

Figure 3B:
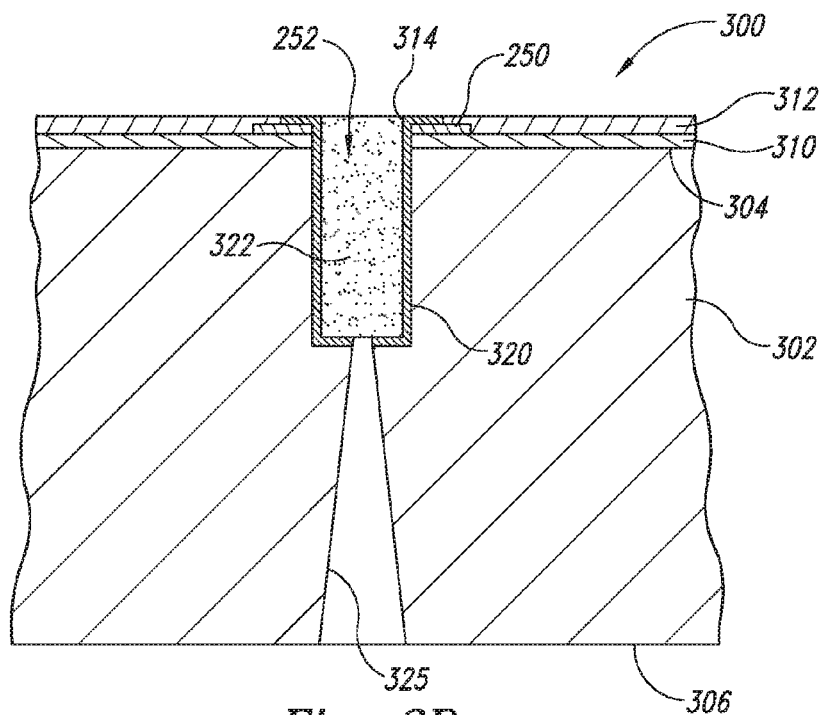

Referring next to FIG. 3B, a conductive fill material 322 is deposited into the via 320 to form the interconnect 252. The fill material 322 can include Cu, Ni, silver (Ag), gold (Au), solder, a conductive polymer, or other suitable materials or alloys of materials having the desired fill properties. The vent hole 325 allows trapped air, gases, or volatile solvents to escape from the larger vias 320 when filling the vias with the conductive fill material 322. The vent hole 325 is an optional structure that may be omitted in several embodiments.

Figure 3C:
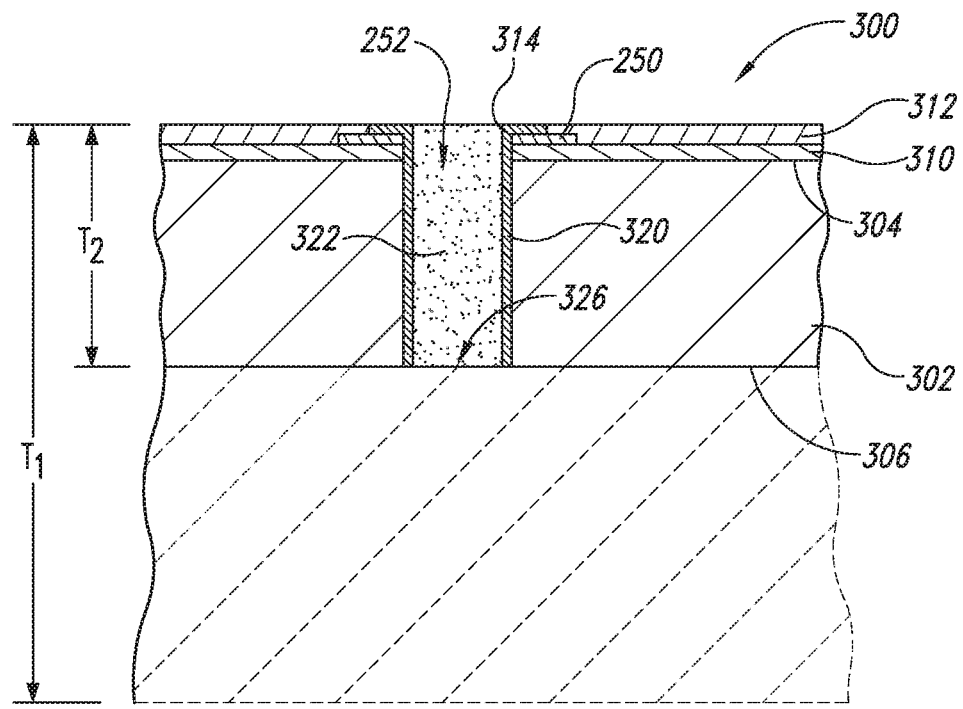

Referring next to FIG. 3C, the substrate 302 is thinned from a first or initial thickness $T_1$ (shown in broken lines) to a second or final thickness $T_2$ by removing material from the back side 306 of the substrate 302. In the illustrated embodiment, a back side portion 326 of each interconnect 252 is at least partially exposed after removing material from the back side 306. In one embodiment, the first thickness $T_1$ of the substrate 302 is approximately 600 to 800 microns, and the second thickness $T_2$ is approximately 50 to 100 microns. The initial and/or final thicknesses can be different in other embodiments. The back side 306 of the substrate 302 can be thinned using chemical-mechanical planarization (CMP) processes, dry etching processes, chemical etching processes, chemical polishing, grinding procedures, or other suitable processes.

Figure 3D:
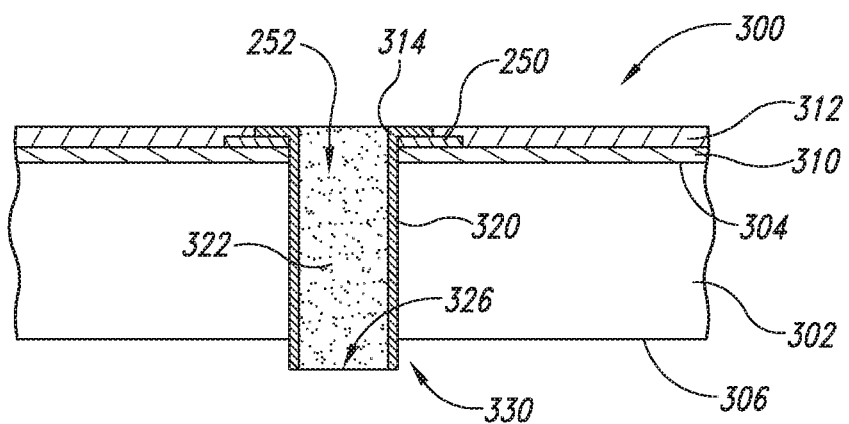

Referring to FIG. 3D, the back side 306 of the substrate 302 is etched back (e.g., using a dry etch or another suitable etching process) to further expose the back side portion 326 of the interconnect 252, thus forming a conductive "post" or projection 330. In other embodiments, other suitable processes in addition to, or in lieu of, the etching process can be used to offset the back side 306 of the substrate 302 from the end of the interconnect 252 to form the post 330. In one embodiment, the post 330 has a height of approximately 10-30 microns above the back side 306 of the substrate 302. In other embodiments, however, the post 330 may have a different height relative to the back side 306.

Figure 3E:
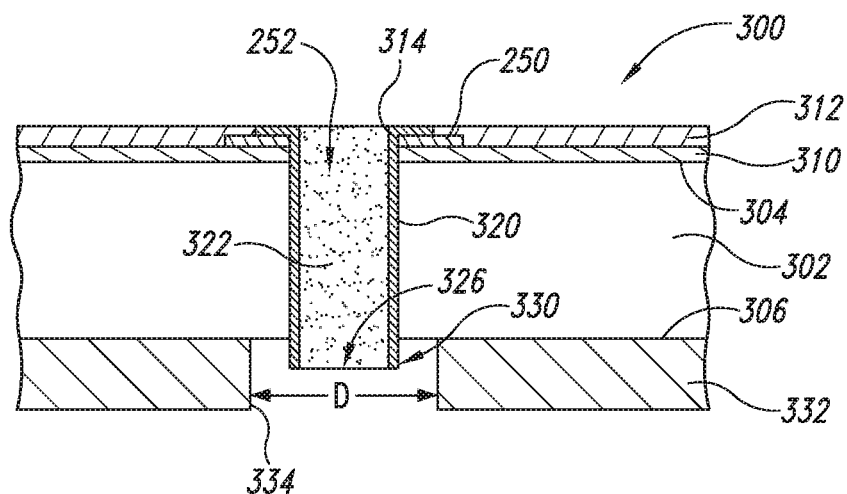

Referring next to FIG. 3E, after forming the post 330, a film or layer 332 is deposited onto the back side 306 to form a portion of the attachment feature 260 (FIG. 2). In one embodiment, the film material can be formed separately from the workpiece 300 and then applied onto desired portions of the workpiece 300 to form the film or layer 332. For example, a wafer-sized portion of film material (i.e., a portion of film material having a size and shape generally corresponding to that of the substrate 302) can be disposed over approximately the entire back side 306. As mentioned previously, for example, the film 332 can be a FOW die attach film composed of a dielectric adhesive material (e.g., an epoxy resin) or another suitable material having the desired properties. Further details regarding suitable FOW die attach films are provided in U.S. Pat. No. 6,388,313, which is incorporated herein by reference in its entirety. Alternatively, the film 332 can have a different size and/or configuration. In one embodiment, for example, the film 332 may be disposed over only a portion of the back side 306 of the substrate 302.

The film 332 includes a plurality of preformed openings or apertures 334 (only one is shown) sized and positioned to expose at least a portion of the corresponding posts 330. In the illustrated embodiment, for example, the opening 334 has a diameter or cross-sectional dimension D greater than a diameter or cross-sectional dimension of the corresponding post 330. The diameter D of the opening 334 can be sized such that both the back side portion 326 of the corresponding interconnect 252 and at least a portion of the back side 306 of the substrate 302 adjacent to the interconnect 252 are exposed. In other embodiments, however, the openings 334 may have a different size and/or arrangement.

As mentioned above, the openings 334 are preformed openings formed in the film 332 before the film material is applied onto the back side 306 of the substrate 302. The openings 334, for example, can be formed in the film 332 using a punching or stamping process, an etching process, or another suitable process. In other embodiments, the openings 334 can be preformed in the film 332 using other suitable techniques. In still other embodiments, the openings 334 may be formed in the film 332 after the film 332 is applied onto the back side 306 (e.g., using an etching process). After applying the film 332 to the back side 306, the film material can be cured (e.g., using a heat process) after application.

Figure 3F:
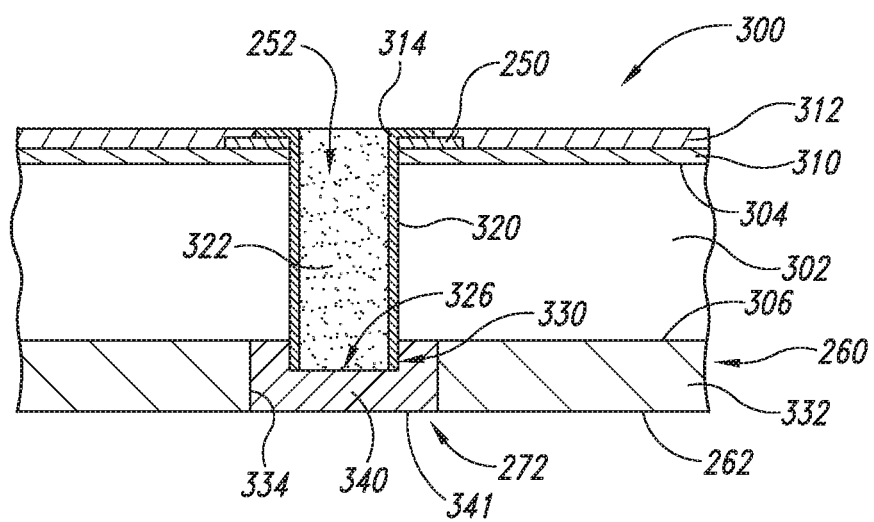

Referring next to FIG. 3F, one or more conductive layers (shown collectively as layer 340) are deposited into the opening 334 and in electrical contact with the post 330 to form the interconnect structures or conductive couplers 272 (only one is shown). The embodiment of the conductive layer 340 is shown schematically as a single layer, but in many embodiments the layer 340 has a number of different conductive materials. Furthermore, although the layer 340 is shown at least approximately completely filling the opening 334, in other embodiments the layer 340 may only fill a portion of the opening 334. The conductive layer 340 can include Cu, Ni, Au, palladium, Ag, solder, a conductive polymer, or other suitable materials or alloys of materials having the desired conductive properties. In one particular embodiment, for example, the layer 340 can include a tri-layer arrangement of conductive materials. The three layers include a first layer of Cu plated onto the post 330, a second layer of Ni plated onto the first layer, and a third layer of Au plated onto the second layer. In another particular embodiment having a tri-layer arrangement, the three layers can include Ni, Au, and palladium. In still another embodiment, the layer 340 may include a single layer of Cu in electrical contact with the post 330. In yet other embodiments, the layer 340 can include other suitable material(s).

Figure 3G:
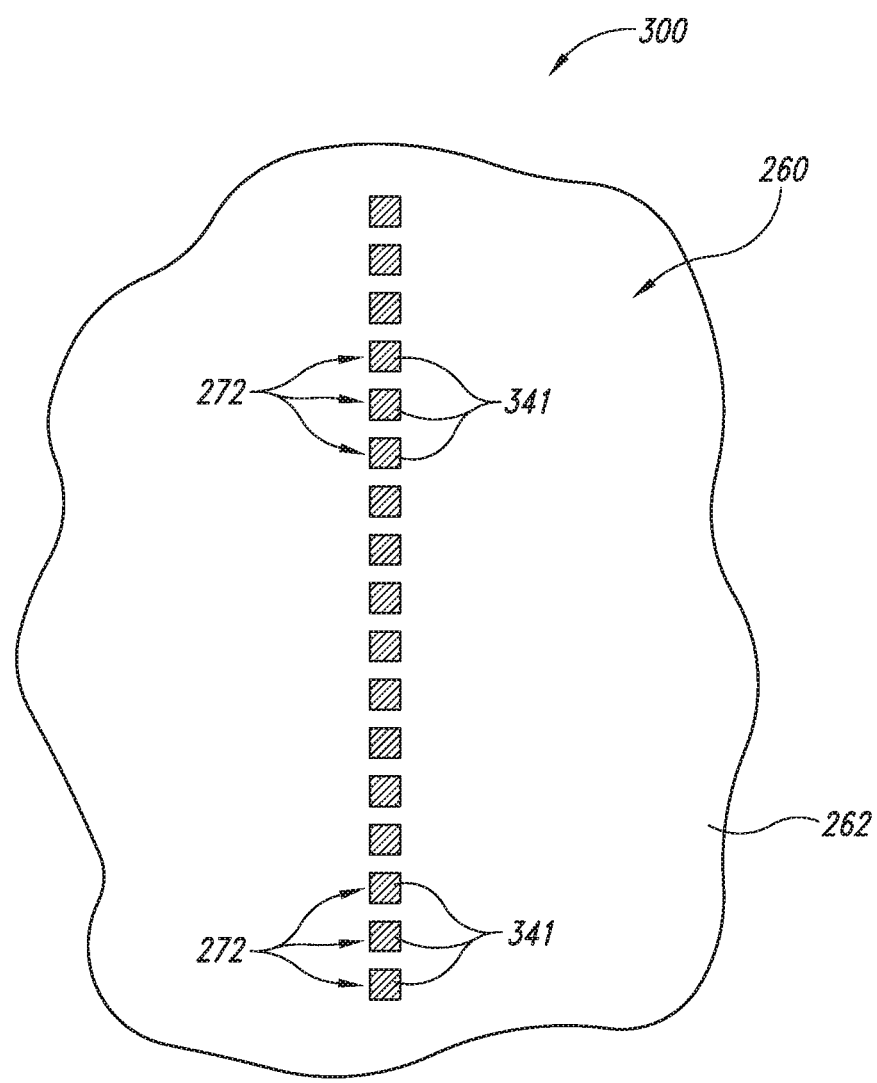

FIG. 3G is a bottom plan view of the portion of the workpiece 300 shown in FIG. 3F. Referring to FIGS. 3F and 3G together, an outer surface 341 of the interconnect structures 272 is approximately co-planar or flush with a bottom surface 262 of the attachment feature 260. The interconnect structures 272 accordingly provide an external electrical connection to other electronic devices at the bottom surface 262 of the attachment feature 260. The generally planar surface across the entire lower portion of the workpiece 300 is expected to enable the attachment feature 260 to form reliable and robust mechanical and electrical connections with a corresponding device (e.g., the first die 220 of FIG. 2) in a stacked configuration without requiring an underfill material or additional electrical connectors. In the embodiment shown in FIG. 3G, the interconnect structures 272 are arranged in a generally linear arrangement and configured to transmit signals to and/or from one or more external devices (not shown). It will be appreciated, however, that the interconnect structures 272 can have a variety of different patterns or arrangements (e.g., a ball-grid array) depending upon the particular arrangement of electrical contacts at the back side 306 of the substrate 302.

In other embodiments, the outer surface 341 of the conductive layer 340 may not be co-planar with the bottom surface 262 of the attachment feature 260. In one embodiment, for example, the outer surface 341 may be recessed relative to the bottom surface 262. In this arrangement, one or more suitable electrical connectors (e.g., a gold bump, solder ball, etc.—not shown in FIGS. 3F and 3G) may be used to electrically and physically couple the interconnect structure 272 to the respective contacts on the corresponding microelectronic device (not shown). In still another embodiment, the outer surface 341 may project outwardly a desired distance beyond the bottom surface 262 of the attachment feature 260.

After forming the attachment feature 260 at the back side 306 of the substrate 302, the workpiece 300 can be singulated to form a plurality of individual microelectronic dies (e.g., the second die 240 of FIG. 2). The attachment feature 260 at the back side 306 of the individual dies can be used to attach the dies to corresponding dies (e.g., the first die 220 of FIG. 2) in a stacked configuration.

Figure 4A:
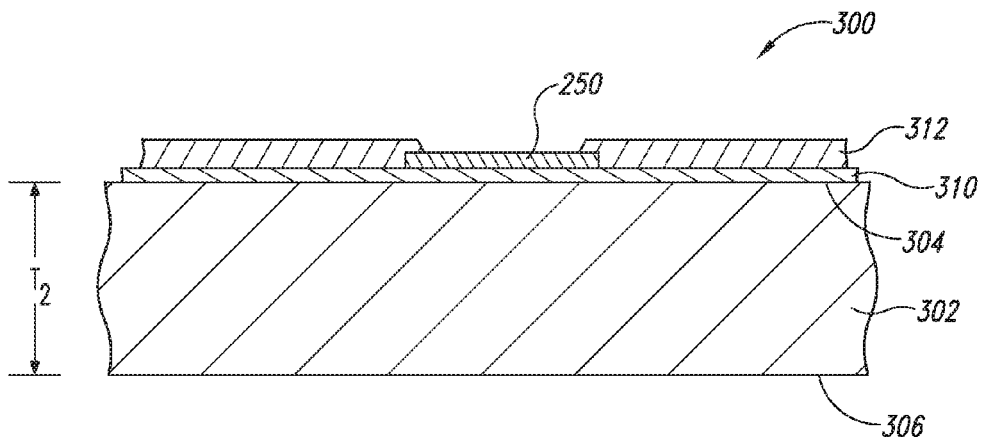
FIGS. 4A-4C illustrate various stages of a method for manufacturing a plurality of microelectronic devices in accordance with another embodiment of the disclosure.
Figure 4B:
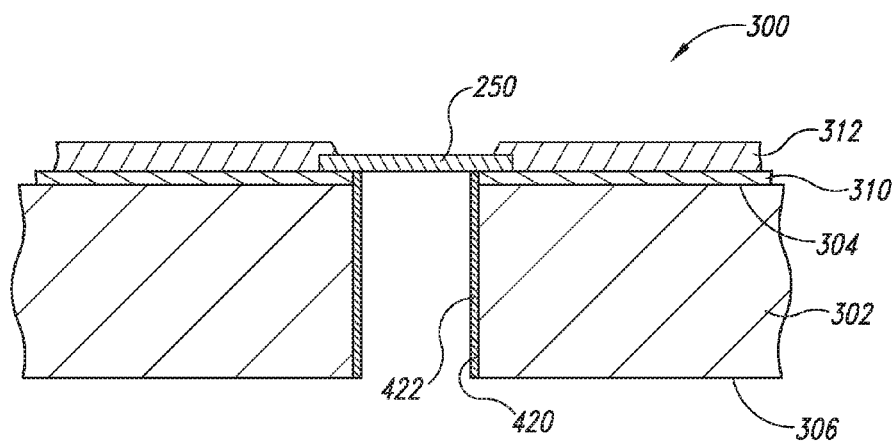
Figure 4C:
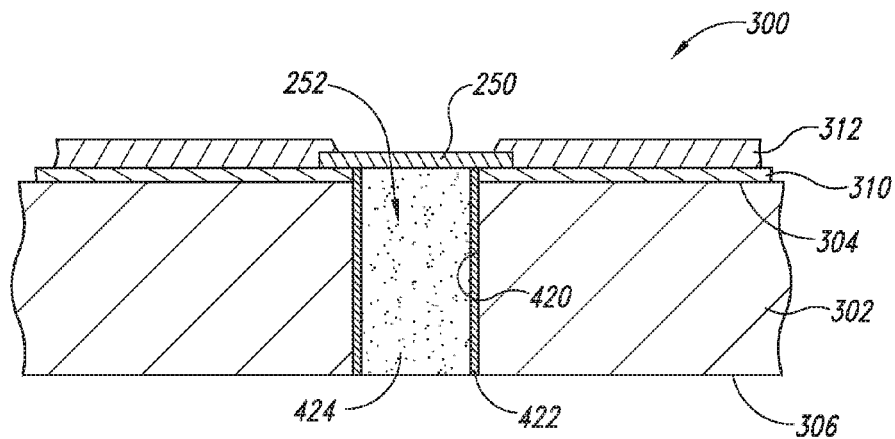

FIGS. 4A-4C are schematic, side cross-sectional views illustrating various stages of a method for forming the second die 240 and the attachment feature 260 of FIG. 2 in accordance with another embodiment of the disclosure. This method begins with the substrate 302, the first dielectric layer 310, the second dielectric layer 312, and the terminal 250. The initial stages of this method are at least generally similar to the steps described above with reference to FIG. 3A, and as such FIG. 4A shows a workpiece configuration similar to that illustrated in FIG. 3A. The process shown in FIGS. 4A-4C, however, differs from the method described above with respect to FIGS. 3A-3G in that a hole or via is formed from the back side 306 of the substrate 302 instead of the front side 304. Before forming the blind hole, the substrate 302 can be thinned by removing material from the back side 306 of the substrate 302 until the substrate 302 has the desired thickness T₂ (e.g., approximately 50-100 microns). The substrate 302 can be thinned using processes similar to those described above with reference to FIG. 3C (e.g., CMP processes, dry etching processes, etc.).

FIG. 4B is a schematic, side cross-sectional view of the substrate 302 after a blind hole or via 420 has been formed through the substrate 302 and the first dielectric layer 310 and in alignment with a corresponding terminal 250. The hole 420 is formed by patterning the back side 306 of the substrate 302 and etching through the substrate 302 from the back side 306. The hole 420 can be etched using one or more etching processes that selectively remove material from the substrate 302 and the first dielectric layer 310 compared to the terminal 250. The hole 420 can alternatively be formed using a laser in addition to or in lieu of etching. If a laser is used to form all or a portion of the hole 420, it is typically cleaned using chemical cleaning agents to remove slag or other contaminants.

After forming the hole 420, the hole 420 is generally lined with another dielectric layer and one or more conductive layers (shown collectively as liner 422). As with the liner 314 of FIG. 3A, the liner 422 is shown schematically as a single layer, but in many embodiments the liner 422 has a number of different dielectric and conductive materials. The liner 422 can include materials generally similar to the liner 314 described above. Referring next to FIG. 4C, a conductive fill material 424 is deposited into the hole 420 to form the interconnect 252. The fill material 424 can be generally similar to the fill material 322 described above with reference to FIG. 3B. The fill material 424 can be deposited into the hole 420 using a solder wave process, electroplating, electroless plating, or other suitable methods. After the fill material 424 has been deposited to form the interconnect 252, the substrate 302 can undergo additional processing steps that are at least generally similar to those described above with reference to FIGS. 3D-3G to construct an attachment feature at the back side 306 of the substrate 302.

Figure 5:
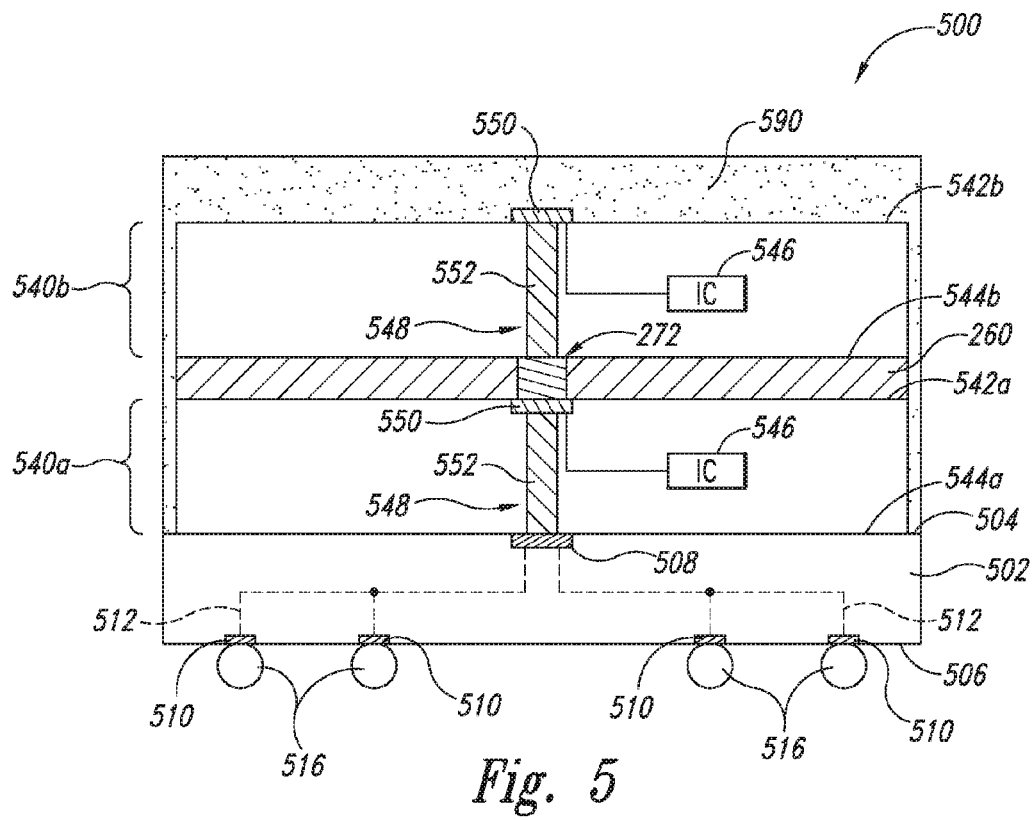
FIG. 5 is a schematic, side cross-sectional view of a packaged microelectronic device configured in accordance with still another embodiment of the disclosure.

FIG. 5 is a schematic, side cross-sectional view of a packaged microelectronic device 500 configured in accordance with an embodiment of the disclosure. The device 500 can include several features generally similar to the device 200 of FIG. 2. For example, the device 500 includes plurality of microelectronic dies 540 (individually identified as a first microelectronic die 540a and a second microelectronic die 540b) interconnected in a stacked-die arrangement with the attachment feature 260. The first die 540a is attached and electrically coupled to a support member 502. The device 500 differs from the device 200 described above in that the lower or bottom die in the stacked arrangement (i.e., the first die 540a) has a different configuration than the lower or bottom die (i.e., the first die 220) of the device 200 shown in FIG. 2. In this embodiment, for example, the first and second dies 540a and 540b are at least approximately identical to each other.

The first and second dies 540a and 540b can have many components generally similar to the second microelectronic die 240 discussed above and illustrated in FIG. 2. For example, the first and second dies 540a and 540b can include integrated circuitry 546 and connectors 548 electrically coupled to the integrated circuitry 546. Each connector 548 can include a terminal or bond site 550 (e.g., a bond pad) and an interconnect 552 coupled to the terminal 550. The interconnects 552 are through-substrate or through-wafer interconnects that extend completely through the respective dies to couple the terminal 550 to corresponding features at back sides 544a and 544b of the first and second dies 540a and 540b, respectively. The attachment feature 260 provides both a physical and an electrical connection between the first and second dies 540a and 540b. For example, the interconnect structure 272 of the attachment feature 260 is coupled to a back side portion of the interconnect 552 of the second or upper die 540b, and electrically couples the second die 540b to the terminal 550 at a front or active side 542a of the first die 540a.

The support member 502 can be generally similar to the support member 202 described above with reference to FIG. 2. For example, the support member 502 includes a first side 504 and a second side 506 opposite the first side 504. The support member 502 also includes an array of support member terminals 508 at the first side 504, an array of contact pads 510 at the second side 506, and a trace 512 or other type of conductive line between each support member terminal 508 and one or more corresponding contact pads 510. The contact pads 510 are arranged in an array for surface mounting the device 500 to a board or module of another device (not shown). A plurality of electrical couplers 516 (e.g., solder balls or conductive bumps) can be attached to corresponding contact pads 510. The device 500 can also include an encapsulant, shell, or cap 590 formed or otherwise deposited over the first and second dies 540a and 540b and at least a portion of the support member 502.

Figure 6:
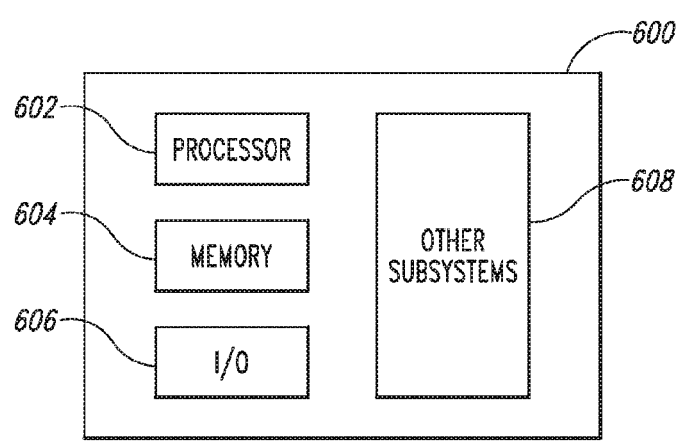
FIG. 6 is a schematic illustration of a system that can include one or more microelectronic devices configured in accordance with embodiments of the disclosure.

The microelectronic devices 200 and 500 or any one of the microelectronic devices formed using the methods described above with reference to FIGS. 1A-5 can be incorporated into any of a myriad of larger and/or more complex systems 600, a representative one of which is shown schematically in FIG. 6. The system 600 can include a processor 602, a memory 604 (e.g., SRAM, DRAM, DDR-SDRAM, flash memory, such as NAND flash memory or other types of flash memory, and/or other suitable memory devices), input/output devices 606, and/or other subsystems or components 608. Microelectronic devices and/or microfeature workpieces (e.g., in the form of microfeature dies and/or combinations of microfeature dies) may be included in any of the components shown in FIG. 6. The resulting system 600 can perform any of a wide variety of computing, processing, storage, sensor, imagers, and/or other functions. Accordingly, representative systems 600 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini-computers. Other representative systems 600 include cameras, light or other radiation sensors, servers and associated server subsystems, display devices, and/or memory devices. In such systems, individual dies can include imager arrays, such as a CMOS imager. Components of the system 600 may be housed in a single unit or distributed over multiple, interconnected units, e.g., through a communications network. Components can accordingly include local and/or remote memory storage devices and any of a wide variety of computer-readable media.

From the foregoing, it will be appreciated that specific embodiments of the disclosure have been described herein for purposes of illustration, but that various modifications may be made without deviating from the spirit and scope of the disclosure. For example, structures and/or processes described in the context of particular embodiments may be combined or eliminated in other embodiments. In particular, the attachment features described above with reference to particular embodiments can include one or more additional features or components, or one or more of the features described above can be omitted. Further, the connections between the attachment feature, the interconnects, and other devices (e.g., bond pads, conductive couplers, and/or external devices) can have arrangements different than those described above. Moreover, while advantages associated with certain embodiments of the disclosure have been described in the context of these embodiments, other embodiments may also exhibit such advantages, and not all embodiments need necessarily exhibit such advantages to fall within the scope of the disclosure. Accordingly, embodiments of the disclosure are not limited except as by the appended claims.

We claim:

1. A system, comprising:
at least one of a processor and a memory device, wherein at least one of the processor and the memory device includes a microelectronic device comprising
a semiconductor substrate including integrated circuitry and bond-pads electrically coupled to the integrated circuitry, wherein the semiconductor substrate has a thickness of between approximately 10 to 50 microns;
through-substrate interconnects in electrical contact with corresponding bond-pads and extending completely through the semiconductor substrate to a terminus at a back side of the substrate; and
an attachment structure at the back side of the semiconductor substrate, wherein the attachment structure comprises
an at least initially flexible dielectric film having a plurality of preformed openings at least partially aligned with the portions of the through-substrate interconnects accessible at the back side of the semiconductor substrate; and
electrical couplers in the openings and in contact with the corresponding accessible portions of the through-substrate interconnects.

2. The system of claim 1 wherein the attachment structure has a thickness less than a thickness of the semiconductor substrate.

3. The system of claim 1 wherein the attachment structure comprises a single, unitary piece of dielectric film having a size and shape corresponding to a size and shape of the back side of the semiconductor substrate.

4. The system of claim 1 wherein the electrical couplers are positioned to electrically couple the through-substrate interconnects to one or more external contacts within a footprint of the semiconductor substrate.

5. The system of claim 1 wherein the dielectric film has a first side in contact with the back side the semiconductor substrate and a second side opposite the first side, and wherein external surfaces of the electrical couplers are at least approximately co-planar with the second side of the dielectric film.

6. The system of claim 1 wherein the dielectric film has a first side in contact with the back side the semiconductor substrate and a second side opposite the first side, and wherein external surfaces of the electrical couplers are not co-planar with the second side of the dielectric film.

7. The system of claim 1 wherein individual preformed openings have a first dimension larger than a second dimension of the back side portions of the corresponding through-substrate interconnects.

8. The system of claim 1 wherein the dielectric film has a thickness less than a thickness of the semiconductor substrate.

9. The system of claim 1 wherein the dielectric film comprises a single, unitary piece of adhesive film having a footprint at least approximately identical to a footprint of the semiconductor substrate.

10. The system of claim 1 wherein the dielectric film comprises a film-over-wire die attach film.

11. The system of claim 1 wherein the electrical couplers comprise one or more layers of a conductive material deposited onto the corresponding back side portions of the through-substrate interconnects.

12. The system of claim 11 wherein the conductive material comprises at least one of Cu, Ni, Au, palladium, solder, and a conductive polymer.

13. The system of claim 1 wherein the electrical couplers comprise a first layer of Cu deposited onto the corresponding back side portions of the through-substrate interconnects, a second layer of Ni deposited onto the first layer, and a third layer of Au deposited onto the second layer.

14. The system of claim 1 wherein the electrical couplers comprise a first layer of Ni deposited onto the corresponding back side portions of the through-substrate interconnects, a second layer of Au deposited onto the first layer, and a third layer of palladium deposited onto the second layer.

* * * * *